(12) United States Patent
Needham et al.

(10) Patent No.: US 9,575,107 B2
(45) Date of Patent: Feb. 21, 2017

(54) ELECTRONIC ARRANGEMENT AND VECTOR NETWORK ANALYZER CHARACTERIZED BY REDUCED PHASE NOISE

(71) Applicant: Minus174, LLC, Meridian, ID (US)

(72) Inventors: Alan Needham, Houston, TX (US); Dale E. Reiser, Meridian, ID (US)

(73) Assignee: MINUS174, LLC, Meridian, ID (US)

( * ) Notice: Subject to any disclaimer, the term of this patent is extended or adjusted under 35 U.S.C. 154(b) by 0 days.

(21) Appl. No.: 14/774,629

(22) PCT Filed: Apr. 25, 2014

(86) PCT No.: PCT/US2014/035519
§ 371 (c)(1),
(2) Date: Sep. 10, 2015

(87) PCT Pub. No.: WO2014/176540
PCT Pub. Date: Oct. 30, 2014

(65) Prior Publication Data
US 2016/0033563 A1    Feb. 4, 2016

Related U.S. Application Data

(60) Provisional application No. 61/815,962, filed on Apr. 25, 2013.

(51) Int. Cl.
*G01R 31/28*    (2006.01)
*G01R 27/28*    (2006.01)

(52) U.S. Cl.
CPC .......... *G01R 27/28* (2013.01); *G01R 31/2841* (2013.01); *H03C 2200/0058* (2013.01)

(58) Field of Classification Search
CPC .... G01R 27/28; G01R 31/2841; G01R 29/26; G11B 20/24; H03C 2200/0058; H03B 2200/009; H03B 2200/0088
See application file for complete search history.

(56) References Cited

U.S. PATENT DOCUMENTS 3,568,078 A  *  3/1971  Pelchat .................. H03D 3/002
                                                     329/320
6,400,233 B1 *  6/2002  Thomas .................. H03C 3/40
                                                     329/304

(Continued)

FOREIGN PATENT DOCUMENTS

JP            05327415 A      12/1993

OTHER PUBLICATIONS

International Search Report and Written Opinion, Aug. 19, 2015, 8 pages; Korean International Searching Authority.

*Primary Examiner* — Son Le
(74) *Attorney, Agent, or Firm* — Brett T. Cooke

(57) ABSTRACT

An electronic arrangement and method for providing a signal characterized by reduced phase noise having a signal source for providing a stimulus signal, a modulator coupled to the signal source for generating a modulated signal as function of the stimulus signal and a local oscillator signal, and a mixer combining the stimulus and modulated signals to generate a mixed signal that includes a component characterized by a mathematical difference of the stimulus signal and the modulated signal. The modulated signal substantially identical to the stimulus signal and being offset by a frequency of the local oscillator signal, so that the difference component of the mixed signal results in a local oscillator signal wherein the stimulus signal phase noise generated by the signal source has been mathematically cancelled.

14 Claims, 4 Drawing Sheets

(56) References Cited

U.S. PATENT DOCUMENTS

| | | |
|---|---|---|
| 2003/0119458 A1 | 6/2003 | Roppongi |
| 2006/0064260 A1 | 3/2006 | Stein et al. |
| 2006/0212555 A1 | 9/2006 | Harada |
| 2012/0154031 A1 | 6/2012 | Zuckerman |

* cited by examiner

ELECTRONIC ARRANGEMENT AND VECTOR NETWORK ANALYZER CHARACTERIZED BY REDUCED PHASE NOISE

CROSS REFERENCE TO RELATED APPLICATIONS

The present application is a U.S. National Stage patent application of International Patent Application No. PCT/US2014/035519, filed on 25 Apr. 2014, which is an International application of and claims priority to U.S. Provisional Patent Application No. 61/815,962, entitled, "VECTOR NETWORK ANALYZER CHARACTERIZED BY REDUCED PHASE NOISE," filed Apr. 25, 2013, the disclosures of which are hereby incorporated by reference in their entirety and the benefits of which are claimed.

TECHNICAL FIELD

The present disclosure relates generally to electrical circuits, electrical apparatus, and specifically to method and apparatus for generating signals with reduced phase noise.

BACKGROUND

A vector network analyzer (VNA) is an instrument that measures amplitude and phase properties of electrical networks. VNAs are often used to characterize two-port networks, although networks having a greater number of ports can also be characterized. A VNA having two test ports permits measurement of four S-parameters—$S_{11}$, $S_{21}$, $S_{12}$, and $S_{22}$. The basic architecture of a VNA typically includes a signal generator, a test set, two or more receivers, and a display unit. The signal generator provides a test signal for the VNA, and the test set routes the signal generator output to the device under test and then to the receivers. A reference channel is also split from the incident wave and routed directly to the receivers to serve as a phase reference. The receivers measure the magnitude and phase of the signal thereby allowing characterization of the electrical network.

Present day VNAs, although sophisticated and armed with a robust array with data processing and display features, do little to minimize phase noise, which may be introduced from the signal generator. Accordingly, it is desirable to provide a VNA that eliminates, or at a minimum, significantly reduces phase noise.

Additionally, other electronic components in numerous RF applications, such as communication, radar, and imaging applications, may benefit from an electronic circuit and method that significantly reduces phase noise.

BRIEF DESCRIPTION OF THE DRAWINGS

Embodiments are described in detail hereinafter with reference to the accompanying figures, in which.

DETAILED DESCRIPTION

Figure 1:
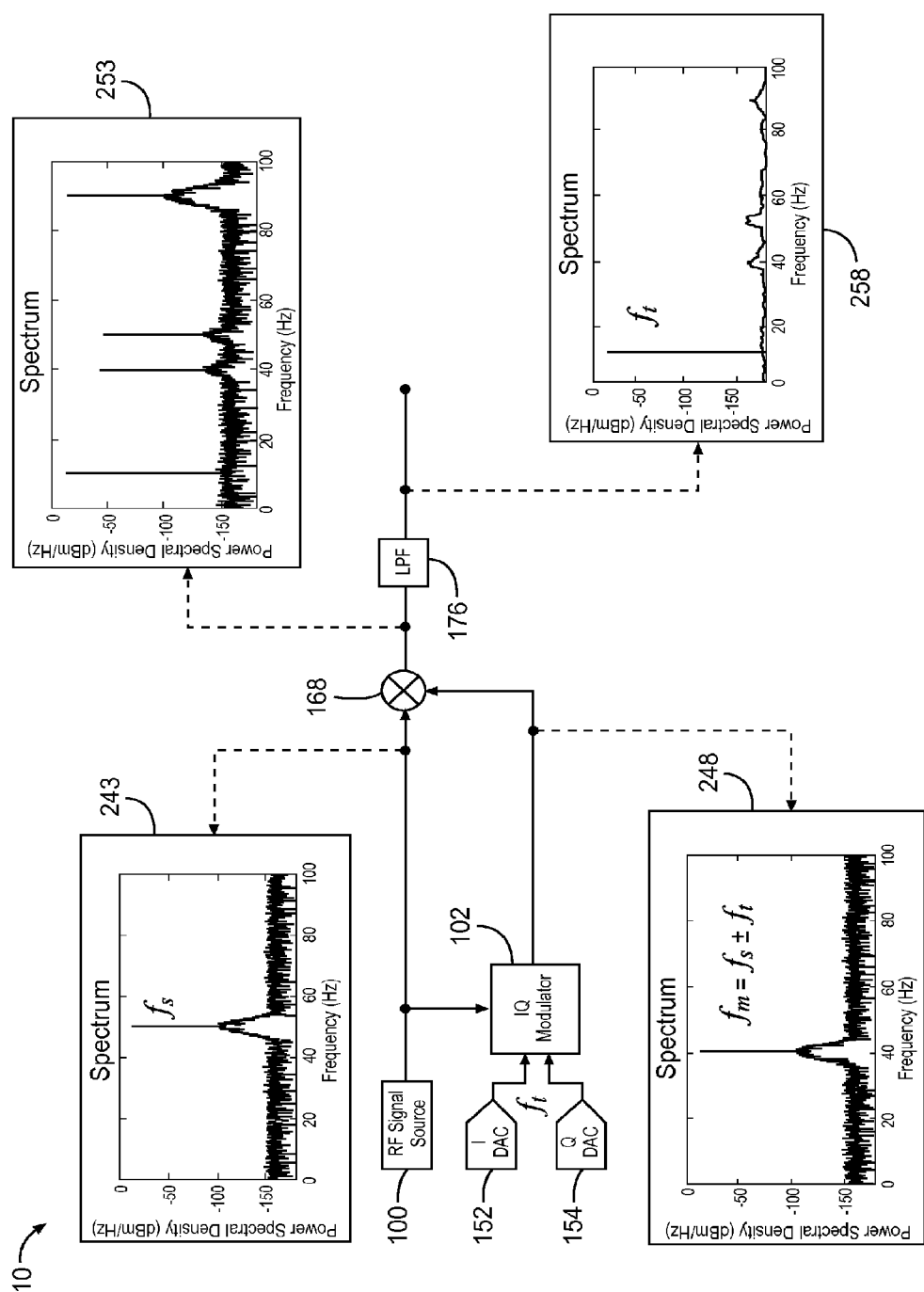
FIG. 1 is a schematic diagram of an electronic arrangement for providing a signal characterized by reduced phase noise according to a preferred embodiment of the invention, showing exemplar signals carried at various points in the arrangement to illustrate at a process of phase noise cancellation.

FIG. 1 illustrates an electronic arrangement 10 for producing a signal at a desired frequency (hereinafter simply the local oscillator (LO) frequency) having phase noise cancellation according to a preferred embodiment of the invention. The particular frequencies, amplitudes, and configuration of arrangement 10 shown are for illustrative purposes only.

A single radio frequency (RF) signal source 100, typically including but not limited to a voltage controlled oscillator (VCO) and phase locked loop (PLL), generates a stimulus signal 243, for example, a sine wave, at a predetermined stimulus frequency $f_s$. The output of the RF signal source 100 is connected to the input of a modulator 102.

In a preferred embodiment, an IQ modulator 102 is provided. IQ modulation, where "I" and "Q" represent "in-phase" and "quadrature" components, is prevalent in RF communications systems. The IQ inputs of the IQ modulator 102 are connected to the outputs of a pair of digital-to-analog converters (DACs)—in-phase DAC 152 and quadrature DAC 154, respectively—which generate I and Q components of a positive frequency sine wave at a desired LO frequency $f_r$. However, in-phase and quadrature DACs 152, 154 are not limited to producing a sine wave, and other suitable waveforms may be used as appropriate.

IQ modulator 102 performs a complex multiplication of stimulus signal 243 from RF signal source 100 with the I and Q signal components from in-phase and quadrature DACs 152, 154. The modulated output signal 248 of IQ modulator 102 is identical to the stimulus signal, except that it is offset, either higher or lower depending on whether the I and Q signal components are leading or lagging, by the LO frequency $f_r$. That is, the modulated output signal 248 is characterized by a frequency $f_m = f_s \pm f_r$. Any phase noise generated by RF signal source 100 is also present, although offset in frequency, in the modulated output signal. In the present example of FIG. 1, $f_m = f_s - f_r$.

The outputs of RF signal source 100 and IQ modulator 102 are both input into an RF frequency mixer 168. Frequency mixer 168 is a nonlinear electrical circuit having two inputs and an output. Frequency mixer 168 creates two new frequencies that are combined at its output from the two signals applied to its two inputs. In some embodiments, mixer 168 may be a double balance mixer, although other mixer types may be used as appropriate. In the present application, stimulus and modulated output signals 243, 248 at frequencies $f_s$ and $f_m$ are applied to mixer 168, and it produces at an output a new signal 253 having components at frequencies of both the sum $f_s+f_m$ and the difference $f_s-f_m$ of the input frequencies.

Because in the present example IQ modulator generates modulated output signal 248 characterized by frequency $f_m = f_s - f_r$, the output signal 253 of mixer 168 has a "sum" component of frequency $2f_s - f_r$, and a "difference" component of simply frequency $f_r$. Because the two input signals 243, 248, including phase noise, are substantially identical, being only offset in frequency, the difference of the two signals 243, 248 yields only the LO frequency $f_l$. Thus, any undesirable phase noise introduced by RF signal source 100 is eliminated by subtraction within mixer 168.

The output of mixer 168 is connected to a low pass filter (LPF) 176, which attenuates the high "sum" component of frequency $2f_s-f_l$, including its associated phase noise. The output signal 258 is the positive frequency sine wave at the desired LO component of frequency $f_l$ with reduced phase noise.

The arrangement of FIG. 1 for cancelling phase noise may applied in numerous RF applications, such as communication, radar, and imaging applications.

Figure 2:
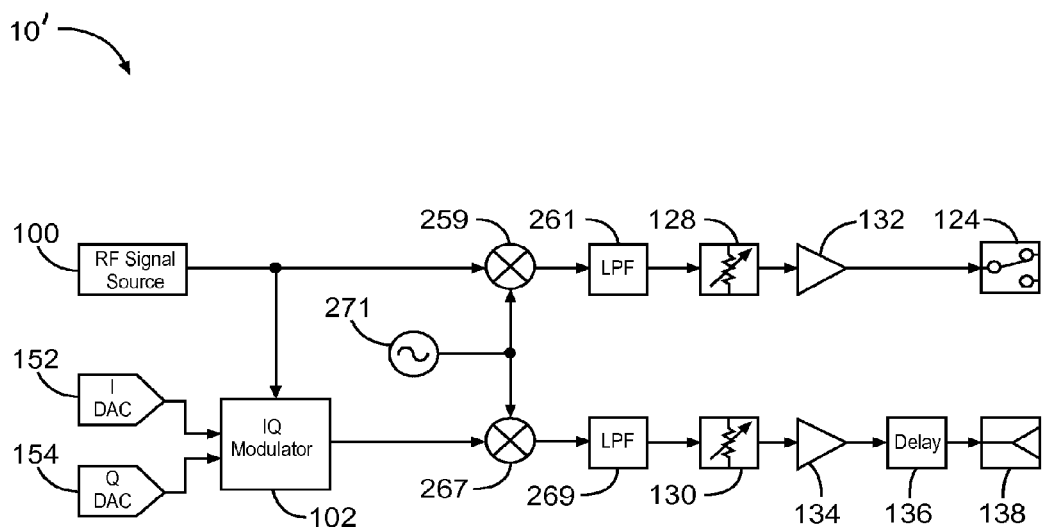
FIG. 2 is a schematic diagram of an electronic arrangement for providing a signal characterized by reduced phase noise according to an alternative embodiment of the invention, showing first and second RF signal sources.

FIG. 2 is an electronic arrangement 10' for producing a signal at a desired LO frequency having phase noise cancellation according to an alternative embodiment of the invention, in which a second RF signal source 271 is provided. The arrangement 10' of FIG. 2 may be substituted in place of the arrangement 10 of FIG. 1 in the VNA 20 of FIG. 5, discussed hereinafter.

As with the arrangement 10 of FIG. 1, single radio frequency (RF) signal source 100, typically including but not limited to a voltage controlled oscillator (VCO) and phase locked loop (PLL), generates a stimulus signal, for example, a sine wave, at a predetermined stimulus frequency. The output of the RF signal source 100 is connected to the input of a modulator 102.

IQ modulator 102 is provided. The IQ inputs of the IQ modulator 102 are connected to the outputs of in-phase DAC 152 and quadrature DAC 154, which generate I and Q components of a positive frequency sine wave at a desired LO frequency. However, in-phase and quadrature DACs 152, 154 are not limited to producing a sine wave, and other suitable waveforms may be used as appropriate. IQ modulator 102 performs a complex multiplication of the stimulus signal from RF signal source 100 with the I and Q signal components from in-phase and quadrature DACs 152, 154. The modulated output signal of IQ modulator 102 is identical to the stimulus signal, except that it is offset by the LO frequency.

The output of RF signal source 100 is also connected to a first input of a stimulus mixer 259. The output of second RF signal source 271 is connected to a second input of stimulus mixer 259. The combined output of the stimulus mixer 259 is connected to the input of a stimulus LPF 261. Similarly, the output of IQ modulator 102 is connected to a first input of the LO mixer 267, and the output of the second RF signal source 271 is connected to the other input of a LO mixer 267. The combined output of LO mixer 267 is connected to the input of a LO LPF 269.

The signals at the outputs of LPFs 261 and 267 are substantially identical, except that the signal output at LPF 267 is offset from the signal output at LPF 261 by the LO frequency. These two signals may be mixed in a RF mixer (not illustrated) as described above with respect to FIG. 1 or below with respect to FIG. 5, for example, to subtract the signals and provide an LO signal with the phase noise being cancelled. A routineer will recognize that for the same reasons discussed above with respect to FIG. 1, as substantially the same signals are applied to both stimulus mixer 259 and LO mixer 267, the phase noise of both the RF signal source 100 and second RF signal source 271 may be cancelled, i.e., subtracted, out.

Figure 5:
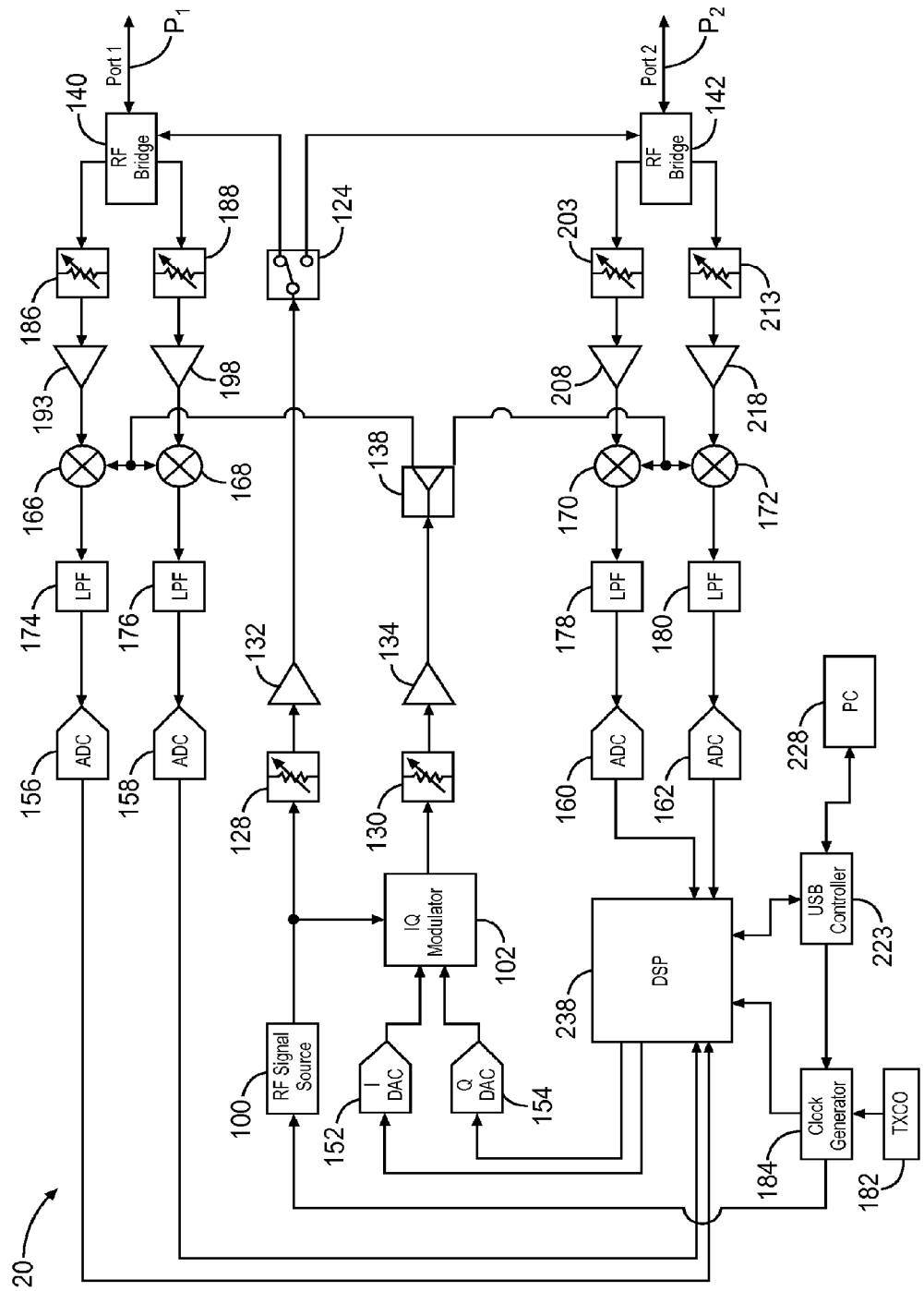
FIG. 5 is a schematic diagram of a vector network analyzer according to an embodiment of the invention that includes the electronic arrangement of FIG. 1.

When arrangement 10' is substituted in place of arrangement 10 of FIG. 1 in VNA 20 of FIG. 5, the output of stimulus LPF 261 may be connected to the input of a stimulus variable attenuator 128. The output of stimulus variable attenuator 128 may connected to the input of a stimulus amplifier 132. The output of stimulus amplifier 132 may be connected to the input of a stimulus switch 124. Similarly, the output of LO LPF 269 may connected to the input of a LO variable attenuator 130. An optional LO variable time delay 136 may be connected between LO amplifier 134 and LO splitter 138. LO variable time delay 136 may be used in the case of a DUT (not shown) characterized by a long time delay. These components are discussed in greater detail below with respect to FIG. 5.

Figure 3:
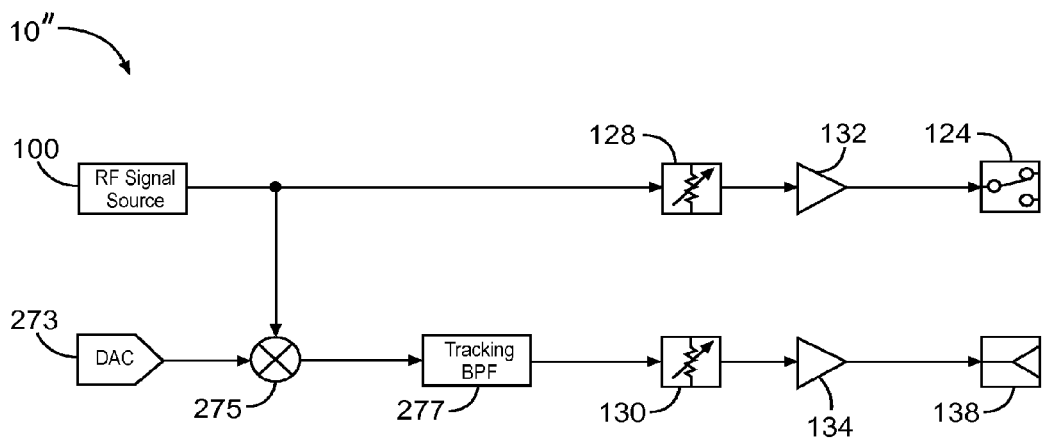
FIG. 3 is a schematic diagram of an electronic arrangement for providing a signal characterized by reduced phase noise according to an alternative embodiment of the invention, showing an alternative modulation technique.

FIG. 3 is a simplified schematic of an electronic arrangement 10" according to an embodiment of the invention, in which an alternative modulation is provided. RF signal source 100, as described above with respect to FIGS. 1 and 2, is provided. Arrangement 10" includes a LO frequency DAC 273. The output of LO frequency DAC 273 connects to a first input of a LO mixer 275. A second input of LO mixer 275 is connected to the output of RF signal source 100.

LO mixer 275 performs a process by which the stimulus signal output by RF signal source 100 is varied in accordance with the LO signal output by LO frequency DAC 273. In other words, LO mixer 275 modulates the stimulus signal with the LO frequency. In particular, LO mixer 275 performs a real number only (as opposed to a complex number) multiplication of the two inputs. Unlike IQ modulator 102 of FIG. 1, the output of LO mixer 275 contains an image of the LO signal. The output of the LO mixer 275 is connected to the input of a LO tracking band pass filter 277, which filters out the image of the LO signal thereby providing a modulated signal substantially identical to the stimulus signal except offset in frequency by the LO frequency.

The signals at the outputs of RF signal source 100 and LO tracking filter 277 are substantially identical, except that the signal output at LO tracking filter 277 is offset from the stimulus signal generated by RF signal source 100 by the LO frequency. These two signals may be mixed in a RF mixer (not illustrated) as described above with respect to FIG. 1 or below with respect to FIG. 5, for example, to subtract the signals and provide an LO signal with the phase noise being cancelled.

When arrangement 10" is substituted in place of arrangement 10 of FIG. 1 in VNA 20 of FIG. 5, the output of RF signal source 100 may be connected to stimulus switch 124 via stimulus variable attenuator 128 and stimulus amplifier 132. Similarly, the output of LO tracking filter 277 may connected to LO splitter 138 via LO variable attenuator 130 and LO amplifier 134. These components are discussed in greater detail below with respect to FIG. 5.

Figure 4:
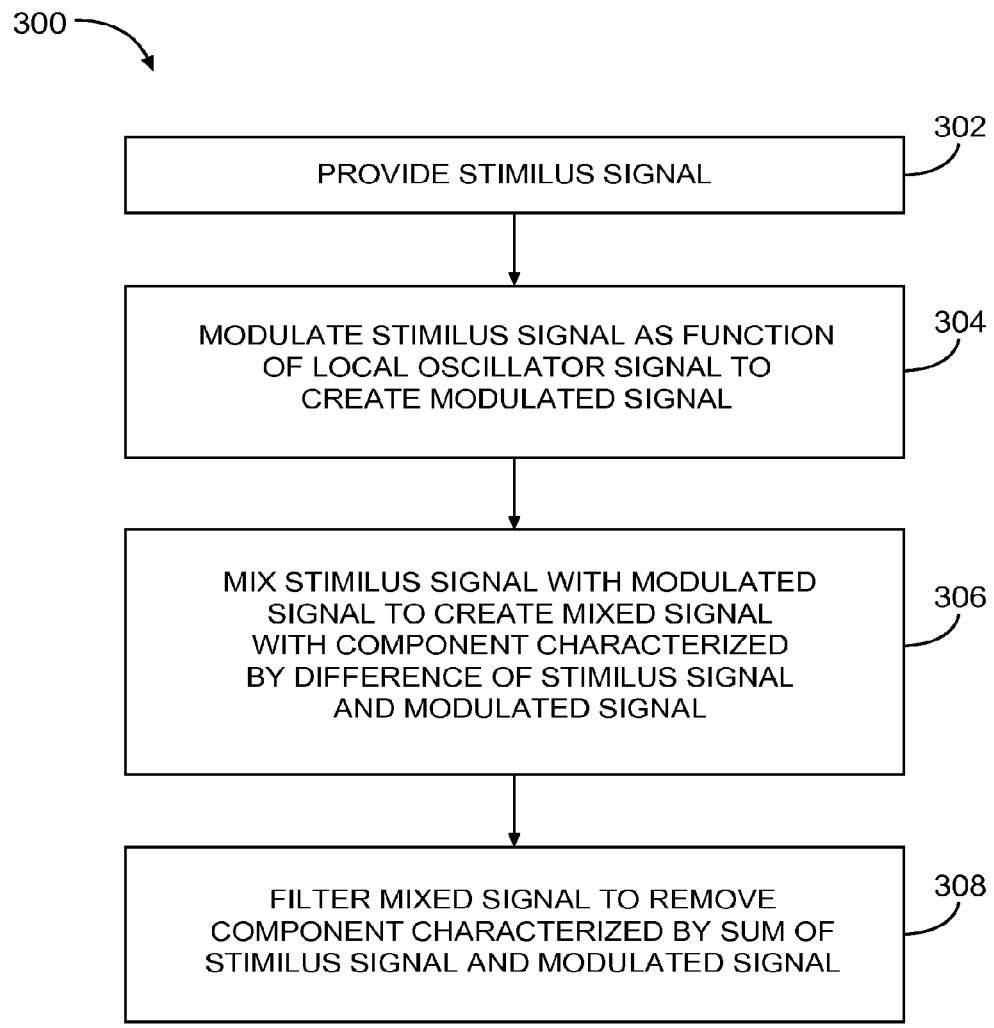
FIG. 4 is a flow chart of a method of cancelling phase noise according to an embodiment of the invention.

FIG. 4 is a flow chart that outlines a method 300 for cancelling phase noise in a signal according to a preferred embodiment. At step 302, a stimulus signal is provided. At step 304, the stimulus signal is modulated as function of a local oscillator signal to create a modulated signal that is substantially identical to the stimulus signal and offset by a frequency of the local oscillator signal. At step 306, the stimulus signal and the modulated signal are mixed to generate a first mixed signal that includes a component characterized by the difference of the stimulus signal and the modulated signal, whereby the difference cancels a phase noise associated with the stimulus signal. At step 308, the mixed signal is filtered to remove a component characterized by the sum of the stimulus signal and the modulated signal, leaving the local oscillator signal that is essentially devoid of phase noise associated with the stimulus signal.

FIG. 5 illustrates an arrangement of a Vector Network Analyzer (VNA) 20 according to a preferred embodiment of the invention. VNA 20 includes a temperature controlled crystal oscillator (TCXO) 182 that is used as a stable reference frequency source. However, other types of frequency reference sources may be used as appropriate. The output of TCXO 182 is connected to a clock generator 184. Using the output reference signal of TCXO 182, clock generator 184 selectively generates and outputs multiple clock signals at various frequencies that are synchronous with the output reference signal of TCXO 182. Clock generator 184 is controlled by a controller 223, which determines the frequency of each of the multiple clock signals generated by clock generator 184. In one embodiment, controller 223 is a universal serial bus (USB) controller 223, in which programming words sent from USB controller 223 to clock generator 184 determine the clock signals. However, other controller topologies may be employed as appropriate.

A single radio frequency (RF) signal source 100, typically including but not limited to a voltage controlled oscillator (VCO) and phase locked loop (PLL), generates a test signal characterized by a user-selectable desired test frequency. As illustrated, clock generator 184 is operatively coupled to RF signal source 100 so that the RF-signal source-generated test signal has a frequency that is synchronized to one of the multiple clock signals output by clock generator 184. The output of the RF signal source 100 is connected to both a stimulus variable attenuator 128 and an IQ modulator 102 so that an identical test signal is supplied to both stimulus variable attenuator 128 and IQ modulator 102.

IQ modulation, where "I" and "Q" represent "in-phase" and "quadrature" components, is prevalent in RF communications systems. The IQ inputs of the IQ modulator 102 are connected to the outputs of a pair of digital-to-analog converters (DACs)—in-phase DAC 152 and quadrature DAC 154, respectively—which generate I and Q components of a positive frequency sine wave. However, in-phase and quadrature DACs 152, 154 are not limited to producing a sine wave, and other suitable waveforms may be used as appropriate. IQ modulator 102 performs a complex multiplication of the test signal from RF signal source 100 with the I and Q signal components from in-phase and quadrature DACs 152, 154. The output of IQ modulator 102 is a sine wave at a the test signal frequency plus the frequency of the I and Q sine waves components. That is, the IQ modulated output signal is identical to the test signal except offset in frequency.

The output of the IQ modulator 102 is connected to a local oscillator (LO) variable attenuator 130, and the IQ modulated output signal is used as the LO signal. LO variable attenuator 130 is used to adjust the power level of the LO signal supplied to the down converting mixers. The output of LO variable attenuator 130 is connected to the input of an LO amplifier 134, and the output of LO amplifier 134 is in turn connected to the input of a LO splitter 138.

The output of the RF signal source 100 is connected to stimulus variable attenuator 128. The output of stimulus variable attenuator 128 is connected to the input of a stimulus amplifier 132, which is in turn selectively connected to first and second test ports $P_1$, $P_2$ by a stimulus switch 124 via respective first and second four-port RF bridges 140, 142. Stimulus switch 124 selects which bridge 140, 142 receives the test signal, and stimulus variable attenuator 128 selectively adjusts the power level of the test signal supplied to the selected bridge. FIG. 1 shows two test ports $P_1$, $P_2$, but the number of test ports may range from one to any number of ports.

A first output of first bridge 140 connects to the input of a first port reference variable attenuator 188. A second output of first port bridge 140 connects to a first port measurement variable attenuator 186. When stimulus switch 124 is supplying the test signal to first bridge 140 ($S_{11}$ parameter measurement), the first and second outputs of bridge 140 carry signals that are proportional to the balance of bridge 140. However, when stimulus switch 124 is instead supplying the test signal to second bridge 142 ($S_{12}$ parameter measurement), the first and second outputs of bridge 140 carry signals that are proportional to the signal received at first test port $P_1$ from a device under test (DUT) (not shown) connected thereto.

Similarly, a first output of second bridge 142 connects to the input of a second port reference variable attenuator 203. A second output of second bridge 142 connects to a second measurement variable attenuator 213. These first and second bridge outputs carry signals proportional to the balance of second bridge 142 when stimulus switch 124 is supplying the test signal to second bridge 142 ($S_{22}$ parameter measurement) and proportional to a signal received at second port $P_2$ from a DUT (not shown) when stimulus switch 124 is supplying the test signal to first bridge 140 ($S_{21}$ parameter measurement).

The outputs of first port reference variable attenuator 188 and first port measurement variable attenuator 186 are connected to the inputs of a first reference amplifier 193 and a first port measurement amplifier 198, respectively. The outputs of first port reference amplifier 193 and first port measurement amplifier 198 are in turn connected to the inputs of a first port reference mixer 166 and a first port measurement mixer 168, respectively. Next, the outputs of first port reference mixer 166 and first port measurement mixer 168 are connected to the inputs of a first port reference low-pass filter (LPF) 174 and a first port measurement LPF 176, respectively. The outputs of first port reference LPF 174 and first port measurement LPF 176 are connected to the inputs of a first port reference analog-to-digital converter (ADC) 156 and a first port measurement ADC 158, respectively. First port reference variable attenuator 188 and first port measurement variable attenuator 186 are used to adjust the signal levels to prevent overload of the ADCs 156, 158.

Similarly, The outputs of second port reference variable attenuator 203 and second port measurement variable attenuator 213 are connected to inputs second port reference ADC 160 and second port measurement ADC 162 via second port reference and measurement amplifiers 208, 218, reference and measurement mixers 170, 172 respectively, and reference and measurement LPFs 178, 180, respectively. Second port reference and measurement variable attenuators 203, 213 are used to adjust the signal levels to prevent overload of ADCs 160, 162.

VNA 20 includes a digital signal processor (DSP) 238. The inputs of in-phase DAC 152 and quadrature DAC 154 are connected to DSP 238, which generates and supplies to the DACs digital words representing the I and Q components of the positive frequency sine wave that is used for IQ modulation. DSP 238 is also connected to the outputs of first and second port, reference and measurement ADCs 156, 158, 160, 162, respectively.

In a preferred embodiment, the clock inputs (not illustrated) to DACs 152, 154 and ADCs 156, 158, 160, 162 are all identical, provided by clock generator 184. Additionally, an identical clock input may be provided to DSP 238. By using clock generator 184 as a common clock source, the clocks for DACs 152, 154 and ADCs 156, 158, 160, 162 are all maintained in synchronicity, thereby eliminating any adverse effects of clock jitter. That is, the LO signal generated by DACs 152, 154 and IQ modulator 102 is synchronized with response signal sampled (and down converted) by ADCs 156, 158, 160, 162, thereby allowing for accurate, coherent phase and amplitude measurements of the DUT (not shown). These DUT measurements sampled by ADCs 156, 158, 160, 162 may be sent by DSP 238 to USB controller 223, which in turn may transfer the DUT measurements to a personal computer (PC) 228 or the like for further calculation and display.

In summary, an electronic arrangement for providing a signal characterized by reduced phase noise, a vector network analyzer, and a method for cancelling phase noise in a signal have been described. Embodiments of the electronic arrangement may generally have: A first signal source defining an output and arranged for providing a stimulus signal; a modulator coupled to the output of the first signal source and arranged for generating at an output a modulated signal as function of the stimulus signal and a local oscillator signal, the modulated signal being substantially identical to the stimulus signal and being offset by a frequency of the local oscillator signal; and a first mixer defining first and second inputs and an output, the output of the first signal source being coupled to the first input of the first mixer, the output of the modulator coupled to the second input of the first mixer, the first mixer arranged to generate a mixed signal that includes a difference of the stimulus signal and the modulated signal; whereby the difference cancels a phase noise associated with the stimulus signal. Embodiments of the vector network analyzer may generally have: A first signal source; a modulator receiving at a first input a stimulus signal generated by the first signal source and at a second input a value relating to a local oscillator signal, the modulator designed and arranged to generate at an output a modulated signal characterized by a mathematical multiplication of the stimulus signal with the value relating to the local oscillator signal, the modulated signal being substantially identical to the stimulus signal and offset by a frequency of the local oscillator signal; a first port coupled to the signal source so as to output the stimulus signal to an input of a device under test; a second port for receiving a response signal from an output of the device under test; a first mixer defining first and second inputs and an output, the output of the first signal source being coupled to the first input of the first mixer, the output of the modulator coupled to the second input of the first mixer, the first mixer arranged to generate a first mixed signal that includes a difference of the stimulus signal and the modulated signal for cancelling a phase noise associated with the stimulus signal; and a second mixer defining first and second inputs and an output, the second port being coupled to the first input of the second mixer, the output of the modulator coupled to the second input of the second mixer, the second mixer arranged to generate a second mixed signal that includes a difference of the response signal and the modulated signal for cancelling a phase noise associated with the stimulus signal. Embodiments of the method for cancelling phase noise in a signal may generally include: Providing a stimulus signal; modulating the stimulus signal as function of a local oscillator signal to create a modulated signal substantially identical to the stimulus signal and offset by a frequency of the local oscillator signal; and mixing the stimulus signal and the modulated signal to generate a first mixed signal that includes a difference of the stimulus signal and the modulated signal; whereby the difference cancels a phase noise associated with the stimulus signal.

Any of the foregoing embodiments may include any one of the following elements or characteristics, alone or in combination with each other: A filter coupled to the output of the mixer and arranged to filter from the mixed signal a sum of the stimulus signal and the modulated signal; the filter is a low pass filter; the modulator is an IQ modulator; an in-phase digital-to-analog converter coupled to an in-phase input of the IQ modulator; a quadrature digital-to-analog converter coupled to a quadrature input of the IQ modulator; the in-phase and the quadrature digital-to-analog converters arranged to generate in-phase and quadrature components defining the local oscillator signal; a digital-to-analog converter defining an output and arranged to generate the local oscillator signal at the output of the digital-to-analog converter; a second mixer defining first and second inputs and an output, the first input of the second mixer coupled to the output of the digital-to-analog converter, the second input of the second mixer coupled to the output of first signal source, the second mixer arranged to generate the modulated signal at the output of the second mixer by multiplication of the stimulus signal and the local oscillator signal; a tracking filter defining an input and an output, the input of the tracking filter coupled to the output of the second mixer, the tracking filter arranged to remove the local oscillator signal from the modulated signal; a second signal source defining an output; a second mixer coupled between the first signal source and the first mixer, the second mixer defining first and second inputs and an output, the first input of the second mixer connected to the output of the first signal source, the second input of the second mixer connected to the output of the second signal source, the output of the second mixer connected to the first input of the first mixer; a third mixer coupled between the modulator and the first mixer, the third mixer defining first and second inputs and an output, the first input of the third mixer connected to an output of the modulator, the second input of the third mixer connected to the output of the second signal source, the output of the third mixer connected to the second input of the first mixer; a first low pass filter coupled to the output of the first mixer and arranged to filter from the first mixed signal a sum of the stimulus signal and the modulated signal; a second low pass filter coupled to the output of the second mixer and arranged to filter from the second mixed signal a sum of the response signal and the modulated signal; the modulator is an IQ modulator arranged to generate the modulated signal characterized by a mathematical complex multiplication of in-phase and quadrature components defining the local oscillator signal; the vector network analyzer further comprises an in-phase digital-to-analog converter coupled to an in-phase input of the IQ modulator and a quadrature digital-to-analog converter coupled to a quadrature input of the IQ modulator, the in-phase and the quadrature digital-to-analog converters arranged to generate the in-phase and quadrature components; a processor coupled to the outputs of the first and second mixers, the processor arranged to characterize the device under test; a first bridge coupled between the first port, an output of the first signal source, and the first mixer; a second bridge coupled between the second port and the second mixer; filtering the first mixed signal to remove a component characterized by a sum of the stimulus signal and the modulated signal; providing in-phase and quadrature components that define the local oscillator signal; modulating the stimulus signal by performing a mathematical complex multiplication of stimulus signal and the in-phase and quadrature components by an IQ modulator; generating the local oscillator signal; mixing the stimulus signal and the local oscillator signal to create the modulated signal; filtering the modulated signal to remove the local oscillator signal from the modulated signal; providing a second signal; mixing the second signal with the stimulus signal; mixing the second signal with the modulated signal; providing the stimulus signal to a device under test; receiving a response signal from the device under test as a function of the stimulus signal; mixing the response signal and the modulated signal to generate a second mixed signal that includes a difference of the response signal and the modulated signal that cancels a phase noise associated with the stimulus signal; comparing the second mixed signal to the first mixed signal; and characterizing the device under test based on the comparing.

The Abstract of the disclosure is solely for providing the a way by which to determine quickly from a cursory reading the nature and gist of technical disclosure, and it represents solely one or more embodiments.

While various embodiments have been illustrated in detail, the disclosure is not limited to the embodiments shown. Modifications and adaptations of the above embodiments may occur to those skilled in the art. Such modifications and adaptations are in the spirit and scope of the invention.

What is claimed:

1. An electronic arrangement for providing a signal characterized by reduced phase noise, comprising:
    a first signal source defining an output and arranged for providing a stimulus signal;
    a modulator coupled to the output of said first signal source and arranged for generating at an output a modulated signal as function of said stimulus signal and a local oscillator signal, said modulated signal being substantially identical to said stimulus signal and being offset by a frequency of said local oscillator signal;
    a first mixer defining first and second inputs and an output, the output of said first signal source being coupled to the first input of said first mixer, the output of said modulator coupled to the second input of said first mixer, said first mixer arranged to generate a mixed signal that includes a difference of said stimulus signal and said modulated signal, whereby said difference cancels a phase noise associated with said stimulus signal;
    wherein said modulator is an IQ modulator; and further comprising,
    an in-phase digital-to-analog converter coupled to an in-phase input of said IQ modulator,
    a quadrature digital-to-analog converter coupled to a quadrature input of said IQ modulator,
    said in-phase and said quadrature digital-to-analog converters arranged to generate in-phase and quadrature components defining said local oscillator signal.

2. An electronic arrangement for providing a signal characterized by reduced phase noise, comprising:
    a first signal source defining an output and arranged for providing a stimulus signal;
    a modulator coupled to the output of said first signal source and arranged for generating at an output a modulated signal as function of said stimulus signal and a local oscillator signal, said modulated signal being substantially identical to said stimulus signal and being offset by a frequency of said local oscillator signal;
    a first mixer defining first and second inputs and an output, the output of said first signal source being coupled to the first input of said first mixer, the output of said modulator coupled to the second input of said first mixer, said first mixer arranged to generate a mixed signal that includes a difference of said stimulus signal and said modulated signal, whereby said difference cancels a phase noise associated with said stimulus signal;
    a digital-to-analog converter defining an output and arranged to generate said local oscillator signal at said output of said digital-to-analog converter;
    a second mixer defining first and second inputs and an output, said first input of said second mixer coupled to said output of said digital-to-analog converter, said second input of said second mixer coupled to said output of first signal source, said second mixer arranged to generate said modulated signal at said output of said second mixer by multiplication of said stimulus signal and said local oscillator signal; and
    a tracking filter defining an input and an output, said input of said tracking filter coupled to said output of said second mixer, said tracking filter arranged to remove said local oscillator signal from said modulated signal.

3. An electronic arrangement for providing a signal characterized by reduced phase noise, comprising:
    a first signal source defining an output and arranged for providing a stimulus signal;
    a modulator coupled to the output of said first signal source and arranged for generating at an output a modulated signal as function of said stimulus signal and a local oscillator signal, said modulated signal being substantially identical to said stimulus signal and being offset by a frequency of said local oscillator signal;
    a first mixer defining first and second inputs and an output, the output of said first signal source being coupled to the first input of said first mixer, the output of said modulator coupled to the second input of said first mixer, said first mixer arranged to generate a mixed signal that includes a difference of said stimulus signal and said modulated signal; whereby said difference cancels a phase noise associated with said stimulus signal;
    a second signal source defining an output;
    a second mixer coupled between said first signal source and said first mixer, said second mixer defining first and second inputs and an output, the first input of said second mixer connected to the output of said first signal source, the second input of said second mixer connected to the output of said second signal source, the output of said second mixer connected to the first input of said first mixer; and
    a third mixer coupled between said modulator and said first mixer, said third mixer defining first and second inputs and an output, the first input of said third mixer connected to an output of said modulator, the second input of said third mixer connected to the output of said second signal source, the output of said third mixer connected to the second input of said first mixer.

4. A vector network analyzer, comprising:
    a first signal source;
    a modulator receiving at a first input a stimulus signal generated by said first signal source and at a second input a value relating to a local oscillator signal, said modulator designed and arranged to generate at an output a modulated signal characterized by a mathematical multiplication of said stimulus signal with said value relating to said local oscillator signal, said modulated signal being substantially identical to said stimulus signal and offset by a frequency of said local oscillator signal;

a first port coupled to said signal source so as to output said stimulus signal to an input of a device under test;

a second port for receiving a response signal from an output of said device under test;

a first mixer defining first and second inputs and an output, the output of said first signal source being coupled to the first input of said first mixer, the output of said modulator coupled to the second input of said first mixer, said first mixer arranged to generate a first mixed signal that includes a difference of said stimulus signal and said modulated signal for cancelling a phase noise associated with said stimulus signal; and a second mixer defining first and second inputs and an output, the second port being coupled to the first input of said second mixer, the output of said modulator coupled to the second input of said second mixer, said second mixer arranged to generate a second mixed signal that includes a difference of said response signal and said modulated signal for cancelling a phase noise associated with said stimulus signal.

5. The vector network analyzer of claim 4, further comprising:

a first low pass filter coupled to the output of said first mixer and arranged to filter from said first mixed signal a sum of said stimulus signal and said modulated signal; and a second low pass filter coupled to the output of said second mixer and arranged to filter from said second mixed signal a sum of said response signal and said modulated signal.

6. The vector network analyzer of claim 4, wherein:

said modulator is an IQ modulator arranged to generate said modulated signal characterized by a mathematical complex multiplication of in-phase and quadrature components defining said local oscillator signal; and said vector network analyzer further comprises an in-phase digital-to-analog converter coupled to an in-phase input of said IQ modulator and a quadrature digital-to-analog converter coupled to a quadrature input of said IQ modulator, said in-phase and said quadrature digital-to-analog converters arranged to generate said in-phase and quadrature components.

7. The vector network analyzer of claim 4, further comprising:

a processor coupled to the outputs of said first and second mixers, said processor arranged to characterize said device under test.

8. The vector network analyzer of claim 4, further comprising:

a first bridge coupled between said first port, an output of said first signal source, and said first mixer; and a second bridge coupled between said second port and said second mixer.

9. The vector network analyzer of claim 6, further comprising:

a clock generator; and first and second analog-to-digital converters coupled to the outputs of said first and second mixers, respectively, said clock generator coupled to said first and second analog-to-digital converters so as to provide a clock signal thereto;

said clock generator coupled to said in-phase and quadrature digital-to-analog converters so as to provide said clock signal thereto; whereby said first and second analog-to-digital converters and said in-phase and quadrature digital-to-analog converters are maintained in synchronicity.

10. A method for cancelling phase noise in a signal comprising the steps of:

providing a stimulus signal;

modulating said stimulus signal as function of a local oscillator signal to create a modulated signal substantially identical to said stimulus signal and offset by a frequency of said local oscillator signal;

mixing said stimulus signal and said modulated signal to generate a first mixed signal that includes a difference of said stimulus signal and said modulated signal, whereby said difference cancels a phase noise associated with said stimulus signal;

providing in-phase and quadrature components that define said local oscillator signal; and modulating said stimulus signal by performing a mathematical complex multiplication of stimulus signal and said in-phase and quadrature components by an IQ modulator.

11. A method for cancelling phase noise in a signal comprising the steps of:

providing a stimulus signal;

modulating said stimulus signal as function of a local oscillator signal to create a modulated signal substantially identical to said stimulus signal and offset by a frequency of said local oscillator signal; and mixing said stimulus signal and said modulated signal to generate a first mixed signal that includes a difference of said stimulus signal and said modulated signal, whereby said difference cancels a phase noise associated with said stimulus signal;

wherein said step of modulating further comprises the steps of generating said local oscillator signal, mixing said stimulus signal and said local oscillator signal to create said modulated signal, and filtering said modulated signal to remove said local oscillator signal from said modulated signal.

12. A method for cancelling phase noise in a signal comprising the steps of:

providing a stimulus signal;

modulating said stimulus signal as function of a local oscillator signal to create a modulated signal substantially identical to said stimulus signal and offset by a frequency of said local oscillator signal;

mixing said stimulus signal and said modulated signal to generate a first mixed signal that includes a difference of said stimulus signal and said modulated signal, whereby said difference cancels a phase noise associated with said stimulus signal;

providing a second signal;

mixing said second signal with said stimulus signal; and mixing said second signal with said modulated signal.

13. A method for cancelling phase noise in a signal comprising the steps of:

providing a stimulus signal;

modulating said stimulus signal as function of a local oscillator signal to create a modulated signal substantially identical to said stimulus signal and offset by a frequency of said local oscillator signal;

mixing said stimulus signal and said modulated signal to generate a first mixed signal that includes a difference of said stimulus signal and said modulated signal, whereby said difference cancels a phase noise associated with said stimulus signal;

providing said stimulus signal to a device under test;

receiving a response signal from said device under test as a function of said stimulus signal; and mixing said response signal and said modulated signal to generate a second mixed signal that includes a difference of said response signal and said modulated signal that cancels a phase noise associated with said stimulus signal.

14. The method of claim 13 further comprising the steps of:

comparing said second mixed signal to said first mixed signal; and characterizing said device under test based on said comparing.

* * * * *